United States Patent [19]
Hayes et al.

[11] Patent Number: 5,479,452
[45] Date of Patent: Dec. 26, 1995

[54] METHOD AND APPARATUS FOR ALIGNING A DIGITAL RECEIVER

[75] Inventors: David J. Hayes; Eric T. Eaton, both of Lake Worth; Von A. Mock, Boynton Beach, all of Fla.

[73] Assignee: Motorola, Inc., Schaumburg, Ill.

[21] Appl. No.: 300,892

[22] Filed: Sep. 6, 1994

[51] Int. Cl.$^6$ .................................................. H04L 27/06
[52] U.S. Cl. .......................................... 375/344; 455/257
[58] Field of Search ............................... 375/97; 455/257

[56] References Cited

U.S. PATENT DOCUMENTS 5,222,079  6/1993  Rasor ........................................ 375/97

OTHER PUBLICATIONS

"SENSAR" Series Service Manual, No. 68P81045C10, 1986, by Motorola, Inc., Schaumburg, Ill., pp. 1–5.

*Primary Examiner*—Stephen Chin
*Assistant Examiner*—Huong Luu
*Attorney, Agent, or Firm*—James A. Lamb

[57] ABSTRACT

A method is used in a receiver (100) for aligning the receiver (100). The method has a step of intercepting and demodulating the FM signal, which includes data symbols. The method has a step of determining error rates, in which the error rates of at least two subsets of the data symbols are determined. Each subset includes a plurality of the data symbols modulated at a unique one of a plurality of frequency deviations. The at least two subsets include data symbols of two opposite polarities. The method has a step of generating a frequency control signal, in which the frequency control signal is determined based on the error rates. The method has a step of aligning a receiver section (105), in which the receiver section (105) is aligned to the FM signal by controlling a local oscillator (320) which is responsive to the frequency control signal.

17 Claims, 9 Drawing Sheets

METHOD AND APPARATUS FOR ALIGNING A DIGITAL RECEIVER

FIELD OF THE INVENTION

This invention relates in general to alignment of a radio receiver to a radio signal and in particular to optimizing the alignment of a radio receiver which receives a radio signal which is frequency modulated by a digital signal.

BACKGROUND OF THE INVENTION

Radio receivers, such as pagers, which receive radio signals frequency modulated by digital signals, are designed to be very small and inexpensive, and typically use both frequency determining circuits and bandpass filters. The frequency determining circuits and bandpass filters have characteristics that are determined at the time of manufacture and which vary from part to part. The frequency determining circuits and bandpass filters also have characteristics determined by time and temperature. For example, the harmonic frequency of a crystal has a part to part make tolerance, as well as time and temperature dependent tolerances. As a further example, the peak frequency, the bandwidth, and the shape of the frequency response curve of a bandpass filter have a part to part make tolerance, and some temperature dependent tolerance. The sensitivity of radio receivers using such frequency determining circuits is affected by these characteristics, as well as an offset of the radio signal being received. The sensitivity of the radio receiver is the ability of the radio receiver to accurately recover information when a radio signal being received is weak or distorted. The offset of the radio signal being received is the difference of the carrier frequency of the radio signal being received from an expected value of the carrier frequency of the radio signal. The sensitivity of the radio receiver is optimized when a local oscillator in the radio receiver converts the carrier frequency of the radio signal to an intermediate frequency (IF) which is optimally aligned to one or more IF filters having a cumulative shape and a bandwidth optimized for the characteristics of the radio signal being received.

For a radio receiver using a design approach involving very low cost and minimal parts count, such as a pager which has receive only capability, the design approach has typically resulted in the use of frequency determining components selected to operate together under worst case conditions of all tolerances, including part to part, temperature, and time tolerances, without including automatic optimal alignment circuits in the radio, such as automatic frequency control circuits, which are well known to one of ordinary skill in the art. This approach has worked well, but this approach limits the receive sensitivity performance in comparison, for example, to that which can be achieved in radio receivers which have relatively high speed, high power circuits, such as radios using synthesized local oscillators and digital signal processors, wherein sophisticated automatic frequency and automatic phase control circuits and methods have been used to optimally align the local oscillator. When optimal alignment methods, including automatic frequency control are not used, the sensitivity is less than optimum because the bandwidth of the IF filter must be widened to accommodate the part to part, time, and temperature variations of the filter (or cumulative filters, when more than one are used), the local oscillator reference (typically a crystal circuit), and the expected received carrier offset.

One method of optimizing receive sensitivity used in pagers is to optimize the part to part variations of frequency determining circuits, such as a crystal circuit, by making adjustments to the value of a part, such as a capacitor, in the crystal circuit. For example, a mechanically variable capacitor is adjusted or a capacitor is laser trimmed in a factory procedure to optimize the frequency of the crystal circuit. Alternatively, in a pager having a voltage controlled oscillator, a correction value to optimize the nominal oscillator frequency can be determined and stored in a factory procedure. These procedures typically adjust the nominal (room temperature) frequency of the frequency determining circuits accurately, using a factory standard frequency reference.

Using a factory standard frequency reference procedure corrects for part to part variations of parts, such as crystals and capacitors, in the frequency determining circuits, but does not adjust the frequency determining circuits to compensate for part to part variations in other circuits, such as an intermediate frequency filter. Such adjustment would further optimize the receive sensitivity of the pager. Unfortunately, presently available procedures involve the use of an analog signal such as a pure carrier, and an analog output, such as an IF output signal, which must be measured to determine a relative gain at various frequencies prior in order to perform an adjustment to optimize the receive sensitivity to compensate for part to part variations in an intermediate frequency filter. This method is too slow to achieve the manufacturing costs necessary to attain competitive pricing.

Another method of optimizing receive sensitivity in a radio receiver having a voltage controllable oscillator and a controller is to adjust frequency determining circuits during the use of the radio receiver. This method compensates for time and temperature variations, and can also compensate for the part to part variations when they are not severe. This method has been accomplished in some radio receivers by analog techniques, which require additional circuitry in radio receivers which are digital in nature, such as an alphanumeric pagers. This method has also been accomplished in other, sophisticated, radio receivers such as cellular radios and commercial portable radios. These sophisticated radios have employed digital signal processors in conjunction with microprocessors for phase locking the radio receivers to a received digital signal, thereby optimizing the receive sensitivity of the radio receiver.

Thus, what is needed is a method of optimizing the sensitivity performance in very small and low cost radios which receive radio signals frequency modulated by a digital signal, which method is usable in a factory alignment method of the radios and/or during use of the radios.

SUMMARY OF THE INVENTION

Accordingly, in a first aspect of the present invention, a method used in one of a factory setup and a maintenance setup is for automatically aligning a receiver section of a selective call receiver. The method includes the steps of generating a frequency modulated (FM) signal, receiving and demodulating the FM signal in the receiver section, decoding a predetermined pattern of data symbols, determining a first error rate, determining a second error rate, and aligning the receiver section. In the step of generating the FM signal, the FM signal is generated from a reference source. The FM signal includes a predetermined pattern of data symbols. Each data symbol modulates the FM signal at one of a plurality of frequency deviations. Each of the plurality of frequency deviations has one of a first and second polarity. In the step of decoding the predetermined pattern of data symbols, the predetermined pattern of data symbols is included in the FM signal which is demodulated in the step of receiving and demodulating. In the step of determining a first error rate, the first error rate of a first subset of the predetermined pattern of data symbols is determined. The first subset of data symbols includes a plurality of data symbols modulated at the first polarity. In the step of determining a second error rate, the second error rate of a second subset of the predetermined pattern of data symbols is determined. The second subset includes a plurality of data symbols modulated at the second polarity. In the step of aligning the receiver section, the receiver section is aligned based on the first error rate and the second error rate determined in the determining steps.

Accordingly, in a second aspect of the present invention, an automatic frequency controller is coupled to a receiver element. The receiver element receives and demodulates a frequency modulated (FM) signal. The FM signal includes a plurality of data symbols. Each data symbol modulates the FM signal at one of a plurality of frequency deviations. Each of the plurality of frequency deviations has one of two opposite polarities. The automatic frequency controller includes an error detector, a frequency controller, and a local oscillator. The error detector, which is coupled to the receiver element, determines error rates of at least two subsets of the data symbols, each subset comprising a plurality of the data symbols modulated at a unique one of the plurality of frequency deviations. The at least two subsets comprise data symbols of the two opposite polarities. The frequency controller, which is coupled to the error detector, generates a frequency control signal based on the error rates of the at least two subsets of the data symbols. The local oscillator, which is coupled to the frequency controller, is controlled by the frequency control signal to align the receiver element to the FM signal.

Accordingly, in a third aspect of the present invention, a selective call receiver is for processing a frequency modulated (FM) signal. The FM signal includes data symbols. Each data symbol modulates the FM signal at one of a plurality of frequency deviations. Each of the plurality of frequency deviations has one of two opposite polarities. The FM signal further includes a selective call address. The selective call receiver includes a receiver element, a control circuit, a sensible alert, and an automatic frequency controller. The receiver element receives and demodulates the FM signal. The control circuit, which is coupled to the receiver element, decodes the data symbols and the selective call address included in the FM signal. The control circuit generates an alert signal when the selective call address matches an address stored in the selective call receiver. The sensible alert, which is coupled to the control circuit, is responsive to the alert signal for generating a sensible alert.

The automatic frequency controller, which is coupled to the receiver element and the control circuit, includes an error detector, a frequency controller, and a local oscillator. The error detector, which is coupled to the receiver element, determines error rates of at least two subsets of the data symbols, each subset comprising a plurality of the data symbols modulated at a unique one of the plurality of frequency deviations. The at least two subsets comprise data symbols of the two opposite polarities. The frequency controller, which is coupled to the error detector, generates a frequency control signal based on the error rates of the at least two subsets of the data symbols. The local oscillator, which is coupled to the frequency controller, is controlled by the frequency control signal to align the receiver element to the FM signal.

Accordingly, in a fourth aspect of the present invention, a method is used in a receiver for aligning the receiver to a frequency modulated (FM) signal. The FM signal includes data symbols. Each data symbol modulates the FM signal at one of a plurality of frequency deviations. Each of the plurality of frequency deviations has one of two opposite polarities. The receiver includes a receiver section which is aligned by a local oscillator. The method includes the steps of intercepting and demodulating the FM signal, including the data symbols, determining error rates, generating a frequency control signal, and aligning the receiver section. In the step of determining error rates, the error rates of at least two subsets of the data symbols are determined. Each subset includes a plurality of the data symbols modulated at a unique one of the plurality of frequency deviations. The at least two subsets include data symbols of the two opposite polarities. In the step of generating a frequency control signal, the frequency control signal is determined based on the error rates determined in the determining step. In the step of aligning the receiver section, the receiver section is aligned to the FM signal by controlling a local oscillator responsive to the frequency control signal.

DETAILED DESCRIPTION OF THE INVENTION

Figure 1:
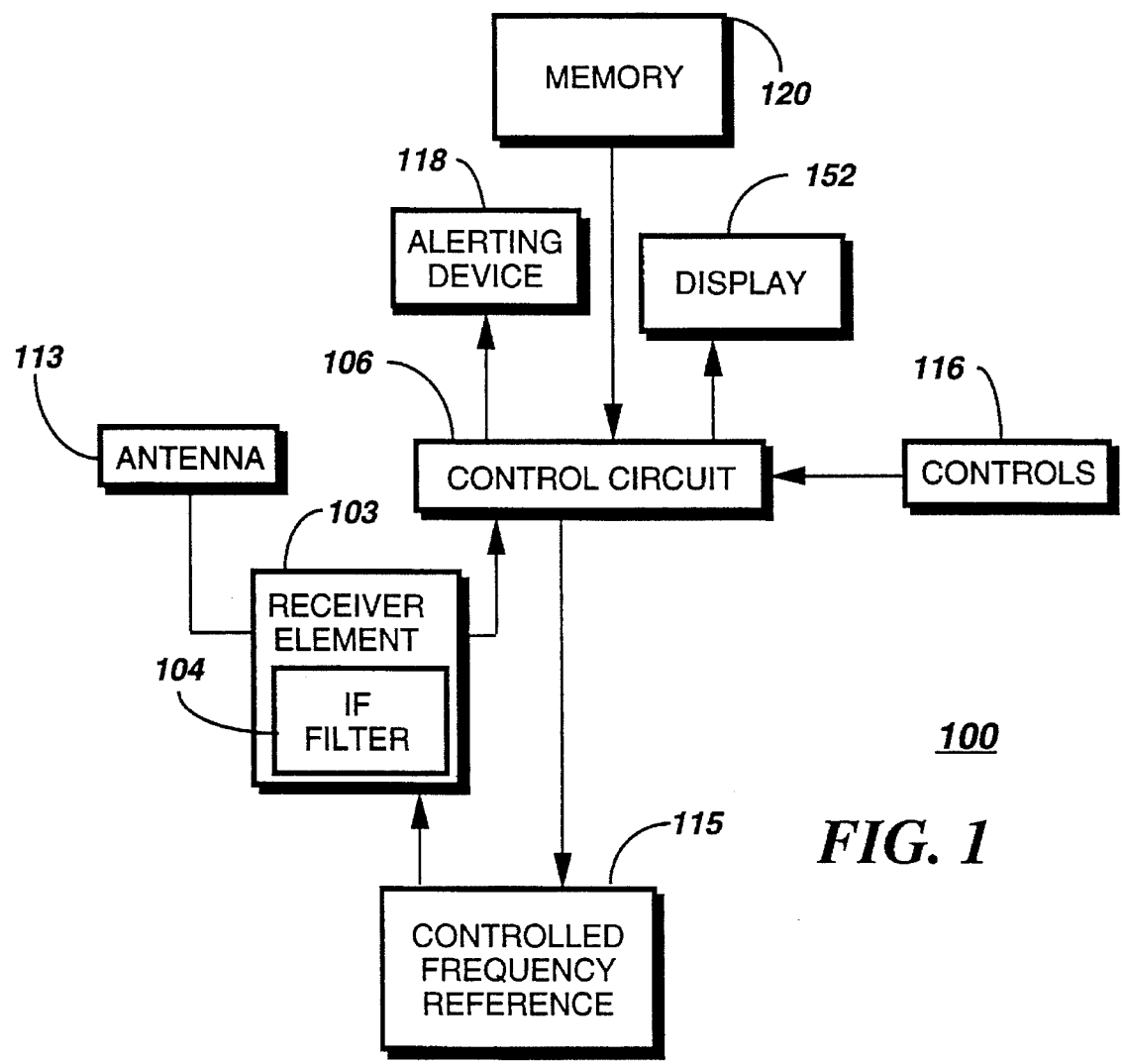
FIG. 1 is an electrical block diagram of a selective call receiver having a voltage controlled frequency reference, in accordance with the preferred embodiment of the present invention.

Referring to FIG. 1, an electrical block diagram of a selective call receiver 100 having a controlled frequency reference 115 is shown, in accordance with the preferred embodiment of the present invention. The selective call receiver 100 operates in a radio communication system to intercept a radio signal having a predetermined carrier frequency which is frequency modulated (FM) with a digital signal. The FM radio signal is intercepted using an antenna 113 which is coupled to a receiver element 103. The receiver element 103 operates to amplify, convert, filter, and demodulate the intercepted radio signal. The demodulated signal is coupled from the receiver element 103 to a control circuit 106, which includes conventional control logic for decoding the demodulated signal, including a selective call message, in a manner well known in the art. The demodulated digital signal is coupled through the control circuit 106 to the controlled frequency reference 115, which generates a local oscillator signal which is coupled to the receiver element 103. The local oscillator signal is used in the receiver element 103 to convert the received signal into an intermediate frequency (IF) signal by converting the carrier frequency into an intermediate frequency, in a conventional manner well known to one of ordinary skill in the art. The receiver element 103 comprises an intermediate frequency (IF) filter 104 used for removing undesirable frequency components from the IF signal in a conventional manner well known to one of ordinary skill in the art. The selective call message comprises an address, a predetermined pattern of binary data symbols, and may include other information such as a telephone number, alphanumeric data, or graphics. A conventional memory 120, which stores a predetermined address, is coupled to the control circuit 106. The control circuit 106 is further coupled to a display 152 and a sensible alerting device 118. The control circuit 106 compares the address recovered from the selective call message to the predetermined address stored in the memory 120 and continues processing the message when the comparison meets predetermined criteria. When the comparison does not meet predetermined criteria, the selective call receiver 100 stops the processing of the selective call message. When the comparison does meet the predetermined criteria, the control circuit 106 further processes the message as determined by the contents of the recovered selective call message and the settings of controls 116, the selective call receiver 100 may further process the selective call message by presenting at least a portion of the selective call message, using the display 152, and by signaling a user via the sensible alerting device 118 that a selective call message has been received. The information which is displayed can include a short message such as a phone number or a longer message such as an alphanumeric inquiry or a small map, any of which can be presented on the display 152 by manipulation of the controls 116 on the selective call receiver 100. It will be appreciated that the selective call receiver 100 could be of the type which also transmits messages and/or acknowledgments by means of radio signals.

The selective call receiver 100 is preferably similar to a Memo Express® model pager, manufactured by Motorola, Inc., of Schaumburg, Ill., modified to have the controlled frequency reference 115, described more fully below, but may alternatively may be another of many selective call receiver radios modified similarly.

The selective call receiver 100 is representative of other portable and mobile devices which include controlled frequency references for receiving a radio signal which is frequency modulated by a digital signal. Other such portable devices include portable and mobile telephones and portable and mobile communication transceivers such as trunked radios.

Figure 2:
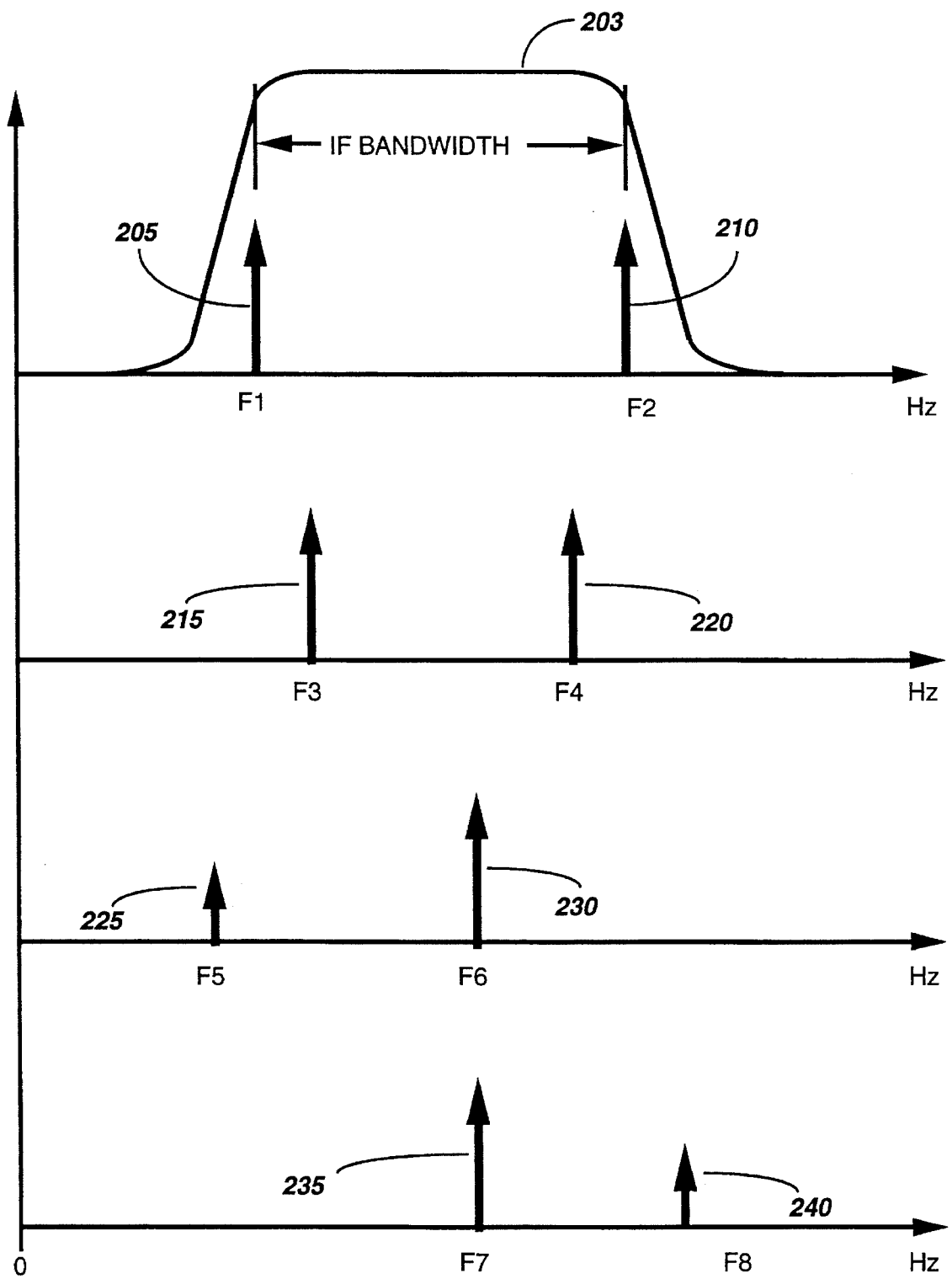
FIG. 2 is a set of frequency plots of a digital radio signal and a response of an intermediate frequency filter used to align the selective call receiver, in accordance with the preferred embodiment of the present invention.

Referring to FIG. 2, a set of frequency plots of a digital radio signal and a response 203 of the IF filter 104 used to align the selective call receiver 100 of FIG. 1 is shown, in accordance with the preferred embodiment of the present invention. The IF filter response 203 shown in FIG. 2 has a low frequency cut off 205 at F1, a high frequency cut off 210 at F2, and a center frequency (not shown) half way between F1 and F2. The resultant IF filter bandwidth, F2-F1, can be a combined response of one or more filter devices, as will be understood by one of ordinary skill in the art.

The radio signal is frequency modulated in this example by a digital signal comprising binary data symbols. The modulation generates deviations of the carrier frequency of first and second polarities, negative and positive, corresponding, respectively, to first and second states of the binary data symbols. In a first example in which the modulated radio signal is symmetrically aligned with the IF filter 104, after the intercepted radio signal is converted in the receiver element 103 to the IF signal, the modulated IF signal 215 has a negative deviated frequency of F3 when the digital signal is in a first of the binary states. Frequency F3 is equal to the IF minus one half the total FM deviation. The modulated IF signal 220 has a positive deviated frequency of F4 when the digital signal is in a second of the binary states. Frequency F4 is equal to the IF plus one half the total FM deviation. In this case the deviated frequencies F3 and F4 fall with in the cut off frequencies of the IF filter F1 and F2 and the resultant data symbol error rate for both deviated signals 215, 220 will be equal.

In a second example in which the modulated signal is misaligned with the IF filter 104, when the intercepted radio signal is converted in the receiver element 103 to the IF signal, the modulated IF signal 225 has a negative deviated frequency of F5 when the digital signal is in the first of the binary states. Frequency F5 is equal to the IF minus one half the total FM deviation. The modulated IF signal 230 has a positive deviated frequency of F6 when the digital signal is in the second of the binary states. Frequency F6 is equal to the IF plus one half the total FM deviation. In this second example, wherein the negative deviated frequency F5 falls below the low frequency cutoff 205 at F1 of the IF filter 104, the modulated IF signal 225 is attenuated resulting in a high data symbol error rate of the one binary state. Since the positive deviated frequency F6 falls between F1 and F2 of the IF filter 104, the modulated IF signal 230 will not be attenuated. This situation will result in a higher data symbol error rate for the first binary state than the second binary state.

In a third example in which the modulated signal is misaligned with the IF filter 104, when the intercepted radio signal is converted in the receiver element 103 to the IF signal, the modulated IF signal 235 has a negative deviated frequency of F7 when the digital signal is in the first of the binary states. Frequency F7 is equal to the IF minus one half the total FM deviation. The modulated IF signal 240 has a positive deviated frequency of F8 when the digital signal is in the second of the binary states. Frequency F8 is equal to the IF plus one half the total FM deviation. In this second example, wherein the positive deviated frequency F8 falls above the high frequency cutoff 210 at F2 of the IF filter 104, the modulated IF signal 240 is attenuated resulting in a high data symbol error rate of the second binary state. Since the negative deviated frequency F7 falls between F1 and F2 of the IF filter 104, the modulated IF signal 235 will not be attenuated. This situation will result in a higher data symbol error rate for the second binary state than the first binary state.

Figure 3:
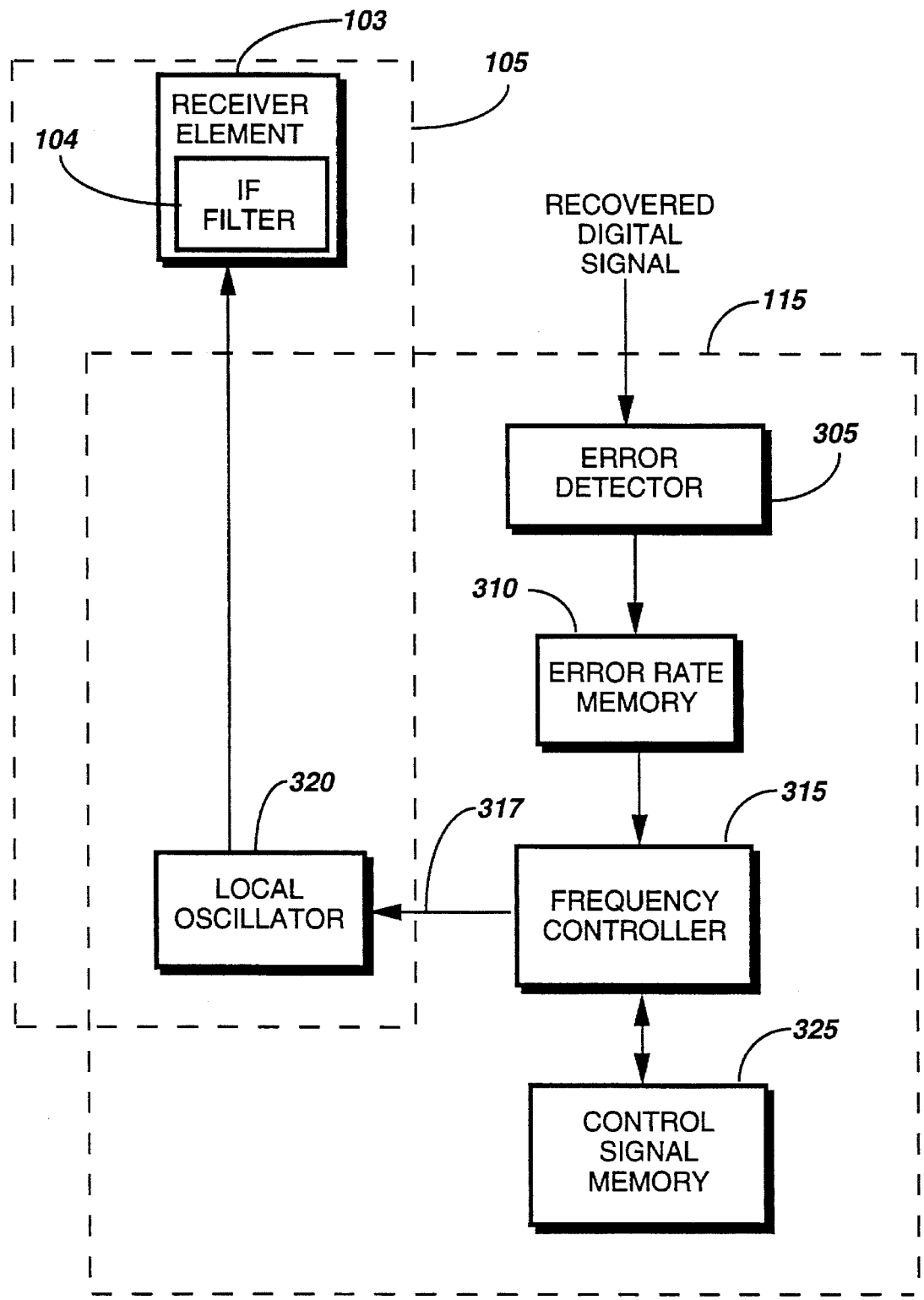
FIG. 3 is an electrical block diagram of a controlled frequency reference and a receiver element used in the selective call receiver, in accordance with the preferred embodiment of the present invention.

Referring to FIG. 3, an electrical block diagram of the controlled frequency reference 115 and the receiver element 103 used in the selective call receiver of FIG. 1 is shown, in accordance with the preferred embodiment of the present invention. The controlled frequency reference 115 comprises an error detector 305, an error rate memory 310, a frequency controller 315, a control signal memory 325, and a local oscillator 320. The demodulated signal coupled to the control circuit 106 from the receiver element 103 is coupled to the error detector 305. The error detector 305 determines from the demodulated signal at least two error rates from a predetermined pattern of binary data symbols or by error correction encoding of the data symbol included in the digital signal, as described below. The error rates are coupled as sets to the error rate memory 310 for storage. One or more sets of prior error rates are coupled from the error rate memory 310 to the frequency controller 315, wherein the error rates are used to adjust a frequency control signal 317, the value of which is stored in the control signal memory 325 coupled to the frequency controller 315. The adjusted control signal is coupled to the local oscillator 320, thereby optimizing the alignment of the receiver element 103 to the FM signal. In the preferred embodiment of the present invention, the local oscillator 320 is a conventional voltage controlled local oscillator, such as varactor controlled crystal oscillator, which generates the local oscillator signal. Alternatively, the local oscillator 320 can be a digitally controlled local oscillator, such as a digital phase lock oscillator. The local oscillator 320 is preferably mounted on a circuit board to which the receiver element 103 components are also mounted. The circuit board to which the receiver element 103 and the local oscillator are mounted is a receiver section 105. The error detector 305, the error rate memory 310, and the frequency controller 315 are preferably implemented in a microprocessor such as a member of the 68HC05 family of microprocessors manufactured by Motorola, Inc. of Schaumburg, Ill., which can be the same microprocessor used to implement portions of the control circuit 106. The error detector 305 and frequency controller 315 are preferably implemented as functions stored in read only memory which use other portions of the microprocessor, and the error rate memory 310 is preferably implemented in an electrically alterable random access memory portion of the microprocessor.

Figure 4:
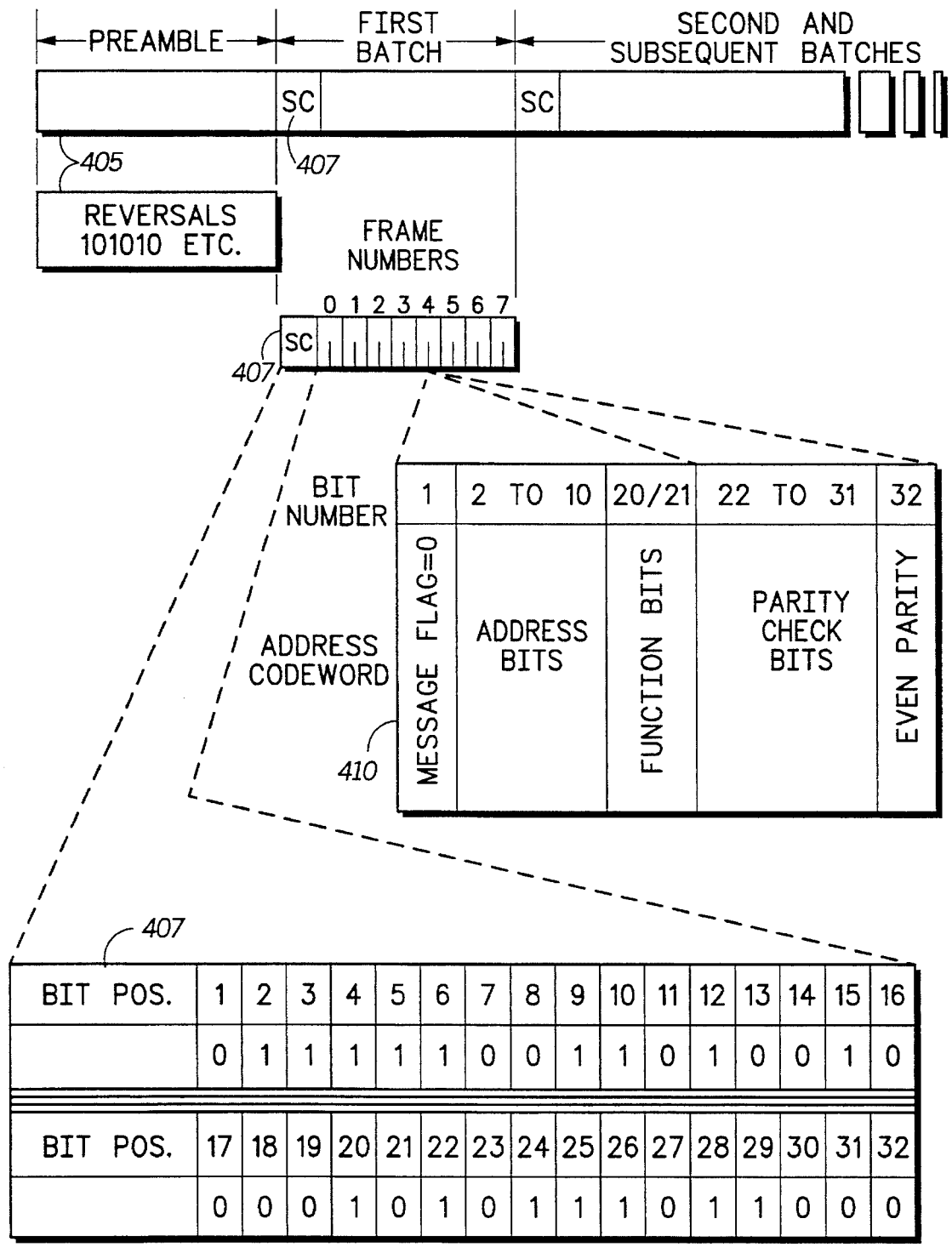
FIG. 4 is a timing diagram showing a standard protocol used for digital signaling in a radio communications system, in accordance with the preferred embodiment of the present invention.

Referring to FIG. 4, a timing diagram showing a standard protocol used for digital signaling in the radio communications system is shown, in accordance with the preferred embodiment of the present invention. The standard protocol is preferably a message coding format used for the national paging system of the British Post Office, and which is widely used by many radio common carrier (RCC) service providers throughout the world for communicating messages in digital radio signals to selective call receivers, including pagers. The standard protocol is commonly known as the POCSAG signaling protocol, or format. Each transmission 400 of the digital radio signal includes binary information transmitted at a bit rate of 512 bits per second for early POCSAG systems, or 1200 and 2400 bits per second for later POCSAG systems. Each transmission 400 consists of a preamble 405 followed by one or more batches of selectively arranged code words. The preamble 405 is a series of reversed binary logic states (or data symbols) 1-0, 1-0, etc., thus providing a predetermined pattern of the binary data symbols. The preamble 405 has a duration of at least 576 bits. A code word is a 32 bit data sequence which contains information either for synchronization or for addressing an individual selective call receiver. Batches of code words begin with a 32 bit synchronization code word 407 which is an invariant predetermined binary sequence. Each batch comprises one synchronization code word 407 and sixteen address or data code words which are subdivided into eight separate frames each containing two address code words, or an address code word and a data code word, or two data code words. Subsequent batches in any message transmission contain the same format of a 32 bit synchronization word 407 followed by eight frames, each containing two address code words, or an address code word and a data code word, or two data code words, for a total of 16 address and/or data code words in a batch.

The address and data code words are grouped into eight frames numbered 0 to 7. The entire selective call receiver address population is similarly divided into eight possible groups, thereby providing each group with a battery saving capability. Each selective call receiver address is allocated to one of the corresponding eight frames according to the three least significant bits of its 21 bit code word identity. Thus, all selective call receivers having addresses which end in 000 would be positioned in frame 0, and similarly, all selective call receivers having an address code word ending in 111 would be in frame 7.

Address code words have a 32 bit structure and bit 1 of an address code word 410 is always 0 as shown in FIG. 4. Bits 2–19 are the address bits corresponding to the 18 most significant bits of the 21 bit identity sequence assigned to an individual selective call receiver. The three least significant bits of the 21 bit identity sequence are not transmitted since they merely serve to define the frame in which the address code word must be transmitted and are therefore derivable from the frame position in a batch. Bits 20 and 21 are two function bits which are used to select the required addresses from the four possible addresses assigned to the selective call receiver. Bits 22 to 31 are parity check bits and the final bit, bit 32, is chosen to give even parity. The decoding system will only examine address code words in a designated frame, and therefore, each selective call receiver's address code word is only transmitted in the frame that is allocated to that code word format.

A data code word also has a 32 bit structure, as shown for the address code word 410 in FIG. 4. However, bit 1 of the data code word is always 1, identifying the code word as a data code word. Bits 2–21 are the data bits corresponding to the message digits, as in a numeric page, or the message characters, as in an alphanumeric message. Five 4-bit BCD numeric digits, or almost three 7-bit ASCII alphanumeric characters can be transmitted in the data bits of each data code word. Bits 22 to 31 are parity check bits and the final bit, bit 32, is chosen to give even parity, as for the address code word.

Each code word, whether it is a synchronization code word, an address code word, or a data code word follows the same 32 bit format in which the most significant bit is transmitted first. The POCSAG signaling protocol has reserved a number of code words for the synchronization code word, and the most commonly used synchronization code word 407 is shown in FIG. 4 with the most significant bit in bit position 1, and least significant bit in bit position 32.

The address, data and synchronization code words described above are a class of error correcting block codes called Bose-Chadhuri-Hocquenghem (BCH). The BCH (31, 21) code word plus an overall even parity bit used in the POCSAG protocol provides a Hamming distance of six which leads to the error correction and detection capabilities of:

1.) Any one or two bit errors can be corrected
2.) Any random 3 bit errors can be detected.
3.) Any single error burst of length not exceeding 7 bits can be detected.
4.) Any single burst of length not exceeding 4 bits can be corrected.

Correction and detection of random errors and burst lengths are dependent upon the hamming distance as well as the code word generating polynomial. Suitable error correction and detection methods described above can be extended to other protocols that employ BCH code words as a means to perform error correction and detection by one of ordinary skill in the art. Other known protocols that provide error correction and detection, through the use of BCH code words, include FLEX and Golay Sequential Coding (GSC).

The 21 bit binary sequence for selective call receiver identity in the POCSAG signaling protocol allows for over two million combinations of possible addresses for selective call receivers. The addition of the two function bits provides a total of eight million message combinations comprising batch signaling functions and selective call receiver addresses.

It will be appreciated that other protocols provide other predetermined data symbol patterns, such as pseudo random patterns and/or other error correcting encoding techniques, such as BCH codes of other lengths or two dimensional block codes, which can be used with the preferred embodiment of the present invention to provide the same benefits described herein.

Figure 5:
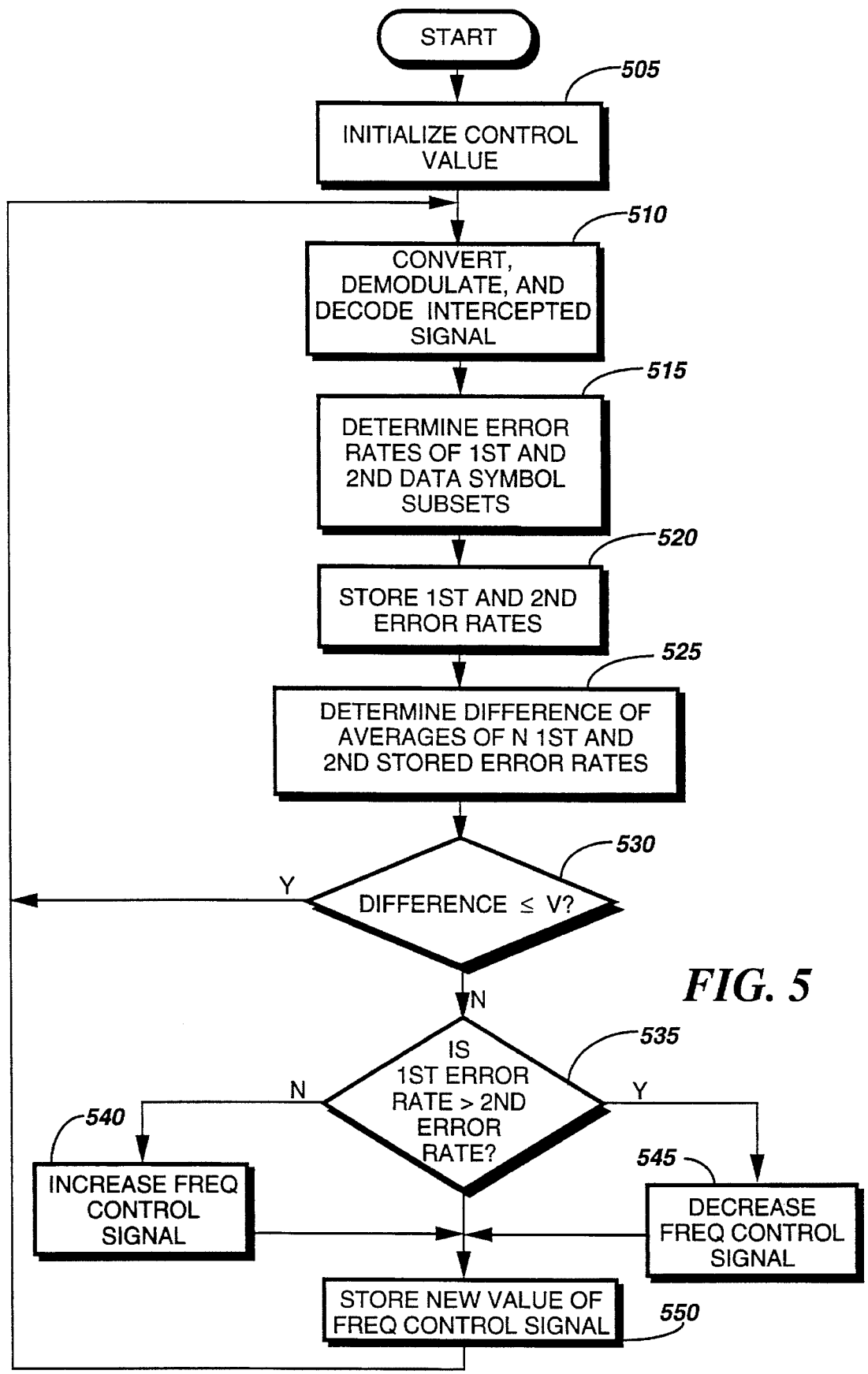
FIG. 5 is a flow chart showing a method used in a selective call receiver for aligning the selective call receiver, in accordance with the preferred embodiment of the present invention.

Referring to FIG. 5, a flow chart showing a method used in a selective call receiver for aligning the selective call receiver of FIG. 1 is shown, in accordance with the preferred embodiment of the present invention. When the selective call receiver 100 is turned on, the controlled frequency reference 115 sets the initial value of the control signal 317 at step 505 to a value stored in the control signal memory 325. At step 510, the selective call receiver 100 generates a recovered digital signal when a frequency modulated radio signal having the POCSAG format described above is intercepted and demodulated. At step 515, the error detector 305 determines error rates of a first and a second subset of data symbols by comparing appropriate portions of the recovered digital signal to the expected preamble 405. The first subset of data symbols preferably consists of all the O's in the preamble 405, and the second set of data symbols consists of all the 1's in the preamble 405. The error rates of the first and second subset of data symbols are stored in the error rate memory 310 as a set of error rates at step 520. At step 525 the frequency controller 315 compares a predetermined number, N, of the sets of prior error rates (including the most recently determined error rate) stored in the error rate memory 310, and generates a set of average error rates, one for each of the two types of data symbols. It will be appreciated that the predetermined number, N, in alternative embodiments, could be as small as 1, and, when it is larger, the comparison can be done using a calculation such as a weighted average of N prior sets with, for example, the most recent measurements being given heavier weights, or with other calculations. When, at step 530, it is determined that the difference between the average error rates of the first and second subset of data symbols is less than or equal to a predetermined value, V, the receiver section 105 is aligned, and the method is repeated at step 510 when a next radio signal is received. When the difference is determined to be greater than the predetermined value, V, the error rates of the first and second subset of data symbols are compared to determine which error rate is higher at step 535. When the error rate of the first subset of data symbols is determined to be greater than the error rate of the second subset of data symbols the frequency control signal is incremented in a first sense at step 540, which in this example is an increasing adjustment. Alternatively, when the error rate of the second subset of data symbols is determined to be greater than the error rate of the first subset of data symbols, the frequency control signal is incremented in a second sense at step 545, which in this example, is a decreasing adjustment. At step 550, the new value of the frequency control signal is stored in the control signal memory 325, and used for setting the frequency of the controlled frequency reference 115. The method is repeated when a next radio signal including appropriate a predetermined pattern is received at step 510.

It will be appreciated that the error rates of first and second subsets of data symbols can be determined by other methods. For example, the predetermined synchronization words 407 of the POCSAG format could be used, or a predetermined pattern of another protocol could be used. Also, as an example, the error rates of the first and second data symbols can be determined by generating a corrected digital signal using the error correction capability of the transmitted code words 410 when the POCSAG format is used and comparing the received digital signal to the corrected digital signal. Error correction encoding of data symbols can be used in other protocols providing them, with the efficacy and reliability of the frequency correction determined by the error correction and detection capability provided therein. Low error correction capabilities of a protocol will result in longer delays to achieving optimal alignment, and insufficient error detection may cause instability and false alignment.

Figure 6:
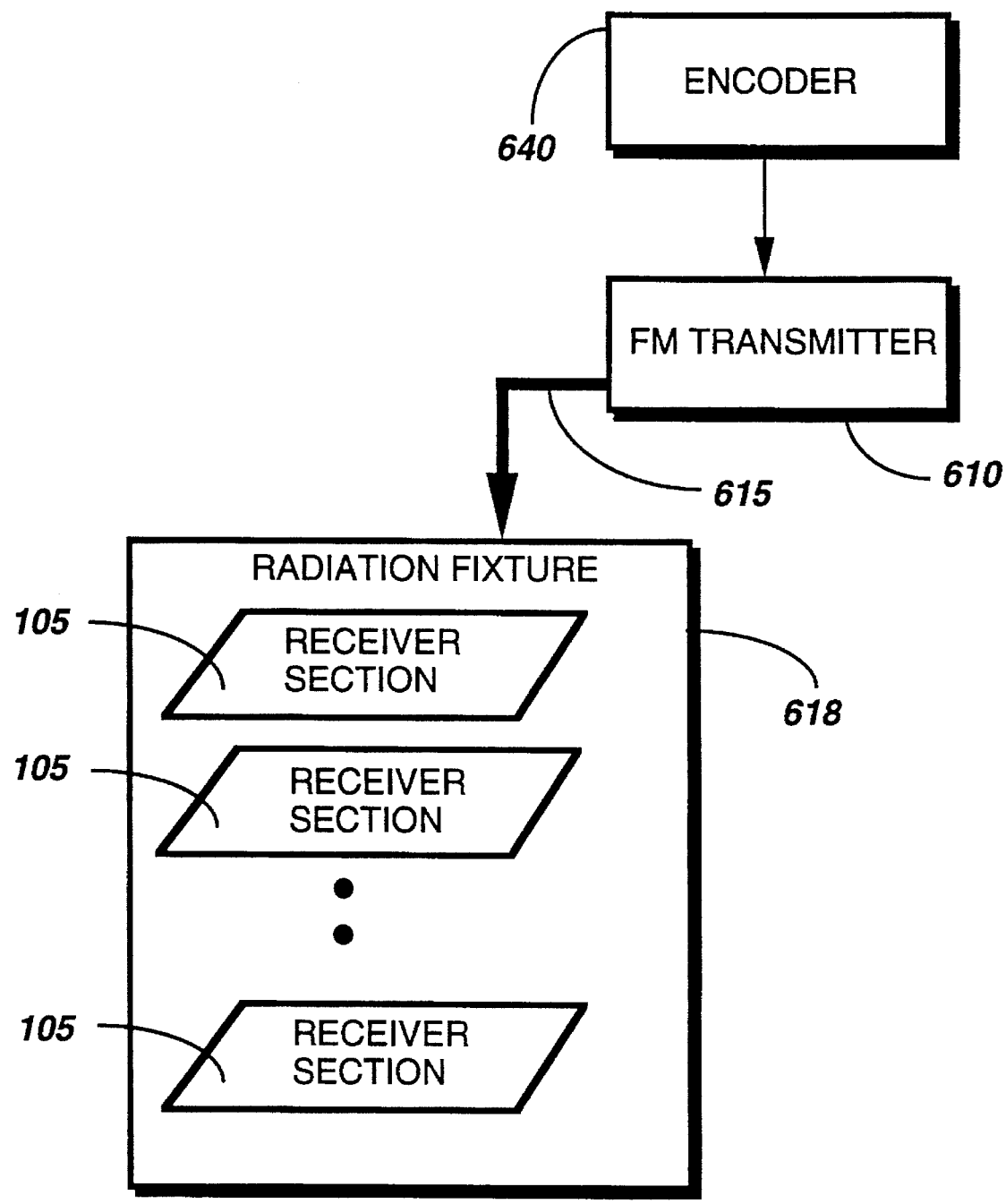
FIG. 6 is an electrical block diagram of a factory alignment setup used for aligning one or more receiver sections used in the selective call receiver, in accordance with the preferred embodiment of the present invention.

Referring to FIG. 6, an electrical block diagram of a factory alignment setup used for aligning one or more of the selective call receivers 100 of FIG. 1 is shown, in accordance with the preferred embodiment of the present invention. The factory alignment set up comprises an encoder 640 coupled to an FM transmitter 610. The encoder 640 generates a digital signal, which in the example used herein is a POCSAG signal. The FM transmitter 610 generates a radio signal having a total modulation deviation set to the desired IF filter bandwidth, which is 14 KHz in this example, coupled by a radio frequency cable 615 to the receiver sections 105 of one or more of the selective call receivers 100, each receiver section 103 coupled to the controlled frequency reference 115 which is used in the factory alignment setup and shipped with the aligned receiver section 105. It will be appreciated that the cable 615 couples the modulated radio signal to the receiver sections 105 in a radiated manner through the antenna 113, as with a radiation fixture, well known to one of ordinary skill in the art. The receiver elements 103 intercept and demodulate the radio signal as described above. The receiver section 105 is then aligned using the factory test setup and the alignment method described above in accordance with the preferred embodiment of the present invention, with the resulting new value of the frequency control signal, determined at step 550, being loaded from the encoder 640 into the selective call receiver 100 and stored in the control signal memory 325 as the initializing value used at step 505, when the selective call receiver 100 is turned on. It will be appreciated that this alignment method, which allows simultaneous alignment of a plurality of receiver sections 105 in accordance with the preferred embodiment of the present invention using one encoder 640 and one FM transmitter 610 is much more efficient than prior art methods which align only one receiver section at a time.

Figure 7:
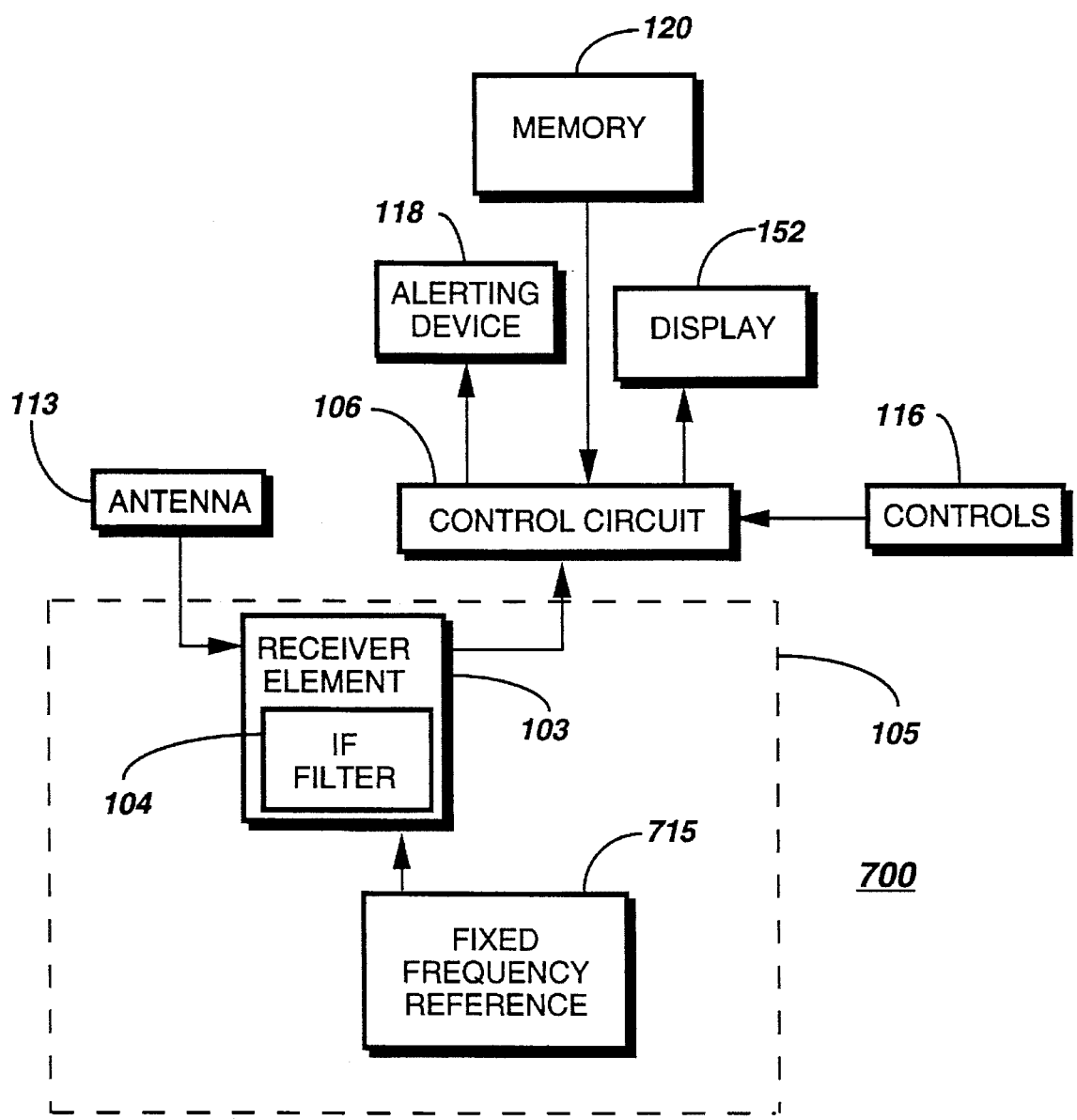
FIG. 7 is an electrical block diagram of a selective call receiver having a fixed frequency reference, in accordance with an alternative embodiment of the present invention.

Referring to FIG. 7, an electrical block diagram of a selective call receiver 700 having a fixed frequency reference 715 is shown, in accordance with an alternative embodiment of the present invention. The selective call receiver 700 operates in a radio communication system to intercept a radio signal having a predetermined carrier frequency which is frequency modulated with a digital signal. The selective call receiver 700 is identical to the selective call receiver 100 except that the selective call receiver 700 has a fixed frequency reference 715 instead of the controlled frequency reference 115, and the control circuit 106 is not coupled to the fixed frequency reference 715 to control the frequency thereof. The fixed frequency reference 715 generates a local oscillator signal which is coupled to the receiver element 103. The fixed frequency reference 715 comprises a conventional crystal oscillator circuit, well known to one of ordinary skill in the art, and is preferably mounted on a circuit board to which the receiver element 103 components are also mounted. The circuit board to which the receiver element 103 and the local oscillator are mounted is a receiver section 105.

The selective call receiver 700 is preferably similar to a Memo Express® model pager, manufactured by Motorola, Inc., of Schaumburg, Ill., but may alternatively may be another of many selective call receiver radios having a fixed frequency reference.

The selective call receiver 700 is representative of other portable and mobile devices which include fixed frequency references for receiving a radio signal which is frequency modulated by a digital signal. Other such portable devices include portable and mobile telephones and portable and mobile communication transceivers such as trunked radios.

Figure 8:
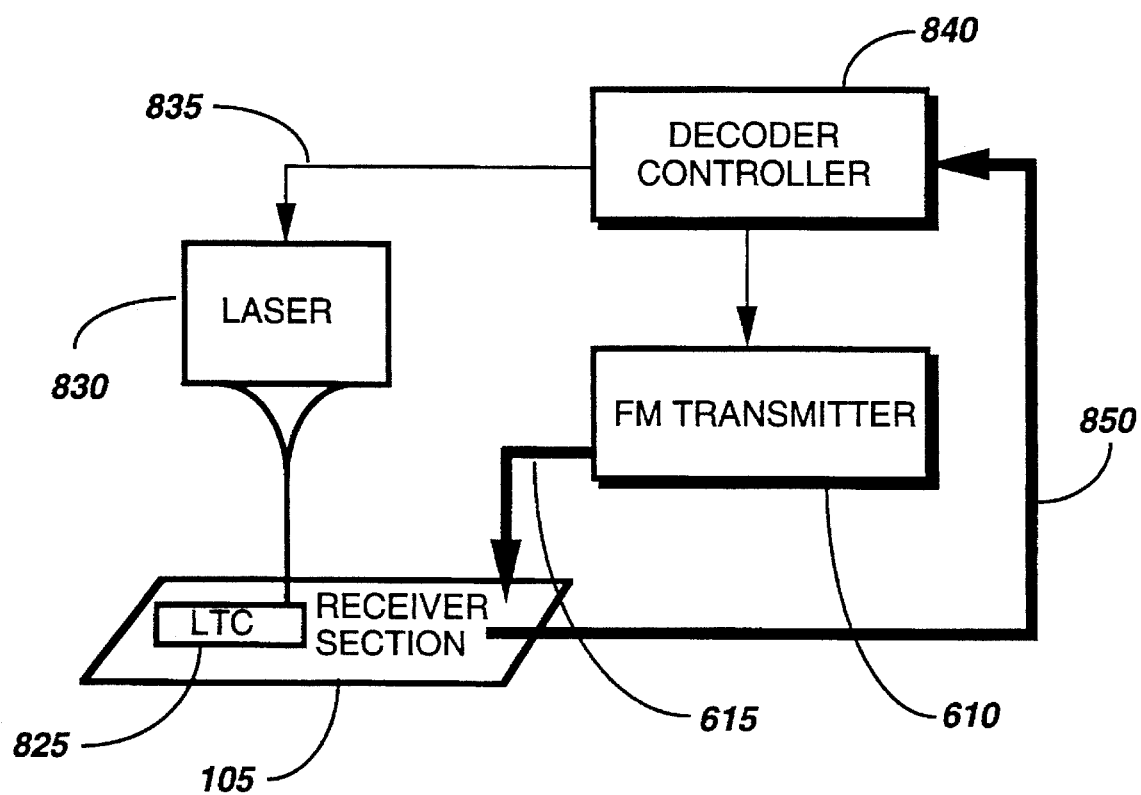
FIG. 8 is an electrical block diagram of a factory alignment setup used for aligning a receiver section used in the selective call receiver of FIG. 7, in accordance with the alternative embodiment of the present invention.

Referring to FIG. 8, an electrical block diagram of a factory alignment setup used for aligning the selective call receiver 700 of FIG. 7 is shown, in accordance with the alternative embodiment of the present invention. The factory alignment set up comprises an FM transmitter 610 which generates a radio signal having a total modulation deviation set to the desired IF filter bandwidth, coupled by a radio frequency cable 615 to the receiver section 105 of the selective call receiver 700. The total deviation is equal to the net difference of the positive and negative modulation deviations. It will be appreciated that the cable 615 may couple the radio signal directly to a test point of the receiver section 105 between the antenna 113 and the receiver section 105, or may couple the radio signal to the receiver section 105 in a radiated manner through the antenna 113, as with a calibrated radiation fixture, well known to one of ordinary skill in the art. The receiver element 103 intercepts and demodulates the radio signal as described above. A decoder/controller 840 is coupled to the receiver section 105 by a first cable 850 to receive and decode a signal transmitted from the receiver element 103, while the decoder/controller 840 communicates alignment instructions to the laser station 830 through a second cable 835. The laser station 830 emits a laser beam which burns away a portion of a laser trimmable capacitor (LTC) 825, thereby incrementally adjusting the frequency of the fixed frequency reference 715. The signal coupled to the decoder/controller 840 is the demodulated signal from the receiver element 103. Alternatively, when the receiver section 105 and control circuit 106 are coupled together during the alignment of the receiver section 105, the signal coupled to the decoder/controller 840 can be a decoder signal from the control circuit 106.

Figure 9:
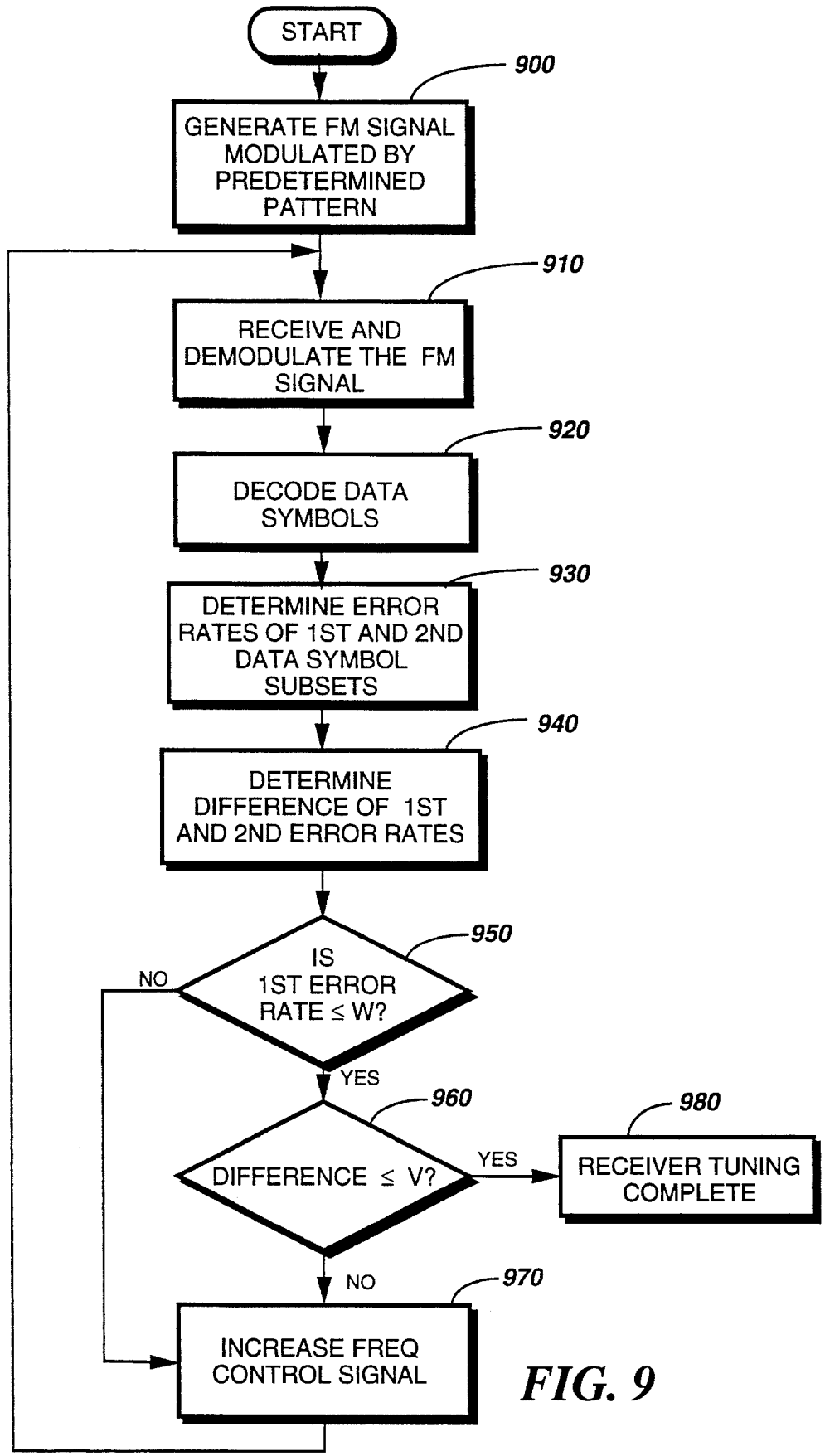
FIG. 9 is a flow chart describing a method used in a factory for aligning the receiver section, in accordance with the alternative embodiment of the present invention.

Referring to FIG. 9, a flow chart describing a method used in a factory for aligning the receiver section 105 used in the selective call receiver 700 of FIG. 7 is shown, in accordance with the alternative embodiment of the present invention. In the alternative embodiment of the present invention a binary signal having a predetermined pattern of first and second binary data symbols is used to FM modulate the radio signal generated by the FM transmitter 610, which is a reference source calibrated to be precisely at the predetermined radio frequency of the selective call receiver 100, at step 900. The first and second data symbols modulate, respectively, the radio signal at two frequency deviations. The predetermined pattern in the alternative embodiment of the present invention has alternating first and second data symbols. A first data symbol subset consists of a plurality of the first data symbols identified within the predetermined pattern, and a second data symbol subset consists of an equivalent plurality of the second data symbols identified within the predetermined pattern. The radio signal is coupled to and demodulated by the selective call receiver 700 at step 910. The receiver section 105 of the selective call receiver 700 is designed such that, when the receiver element 103 and fixed frequency reference 715 are fabricated, the frequencies of the IF signals are offset in a predetermined manner, having modulated IF signals such as signals 225, 230 (FIG. 2) which are not symmetrical in the IF filter 104 bandwidth. A laser trimmable component which is a part in the fixed frequency reference 715 can be laser trimmed to alter the frequencies of the IF signals in the receiver element 103 to become symmetrically aligned to the IF filter 104 bandwidth, as are the IF signals 205, 210 (FIG. 2). The decoder/controller 840 decodes the demodulated signal coupled from the receiver element 103 at step 920, generating two subsets of demodulated data symbols, corresponding, respectively, to the two data symbol subsets of the predetermined pattern of data symbols. At step 930 the decoder/controller 840 determines the error rate of each of the first and second demodulated data symbol subsets by comparing the values of the demodulated data symbol subsets recovered from the received radio signal to the corresponding values of the predetermined pattern in the transmitted radio signal. The difference of the first and second data symbol subset error rates is determined at step 940. When the error rate of the first data symbol subset is less than or equal to a predetermined threshold, W, at step 950, and the difference of the error rates of the first and second data symbol subsets is less than or equal to a predetermined threshold, V, at step 960, the receiver section is aligned and the method is stopped, at step 980. When the error rate of the first data symbol subset is greater than the predetermined threshold, W, at step 950, or when the error rate of the first data symbol subset is less than or equal to the predetermined threshold, W, at step 950 and the difference of the error rates is greater than the predetermined threshold, V, at step 960, the decoder/controller 840 instructs the laser alignment station 830 to laser trim the fixed frequency reference 715 an incremental amount at step 970, and the method is continued when another predetermined pattern is received, at step 910.

It will be appreciated that in a selective call receiver 700 having a fixed frequency reference 715 of alternative design wherein laser trimming of the component in the fixed frequency reference 715 reduces the IF frequencies, the positively deviated IF signal 240 corresponding to the second binary state initially falls outside the high frequency cut off 210 at F2, and the method for aligning the receiver section 105 decreases the local oscillator frequency of the fixed frequency reference 715 until the data symbol error rate of the positively deviated signal 240 is approximately equal to the data symbol error rate of the negatively deviated signal 235 and the error rate of the first data symbol is less than a data symbol error rate threshold resulting in a frequency spectrum plot as described above with respect to the first example (FIG. 2). It will be appreciated that alternative embodiments exist in which signals from other locations on the receiver section 105 are sensed by the decoder/controller 840. For example, the IF signal can be coupled to the decoder/controller 840 and conversion to baseband and demodulation could be performed in the decoder/controller 840. As another example, the receiver section 103 could be aligned while coupled to the control circuit 106 of the selective call receiver 100, and the comparison of the first and second demodulated data symbol subsets to the predetermined subsets could be performed in the control circuit 106, with the results being coupled as error rates to the decoder/controller 840. It will be further appreciated that any predetermined pattern providing sufficient quantities of ones and zeroes will suffice, although some patterns, such as those with very asymmetrical occurrences of first and second data symbols, can result in slower completion of the alignment method.

It will be further appreciated that the factory alignment setups and method in accordance with the preferred and alternative embodiments of the preferred invention can be used equally well for maintenance alignments.

It will be further appreciated that other alternative embodiments of the present invention can be used when the fixed frequency reference 715 is aligned by such method as adjusting a mechanically adjustable capacitor or setting an offset value in a memory for establishing a phase locked loop oscillator frequency. When the fixed frequency reference 715 is aligned by adjusting a mechanically adjustable capacitor, the laser 830 is replaced by a robot having a tool which is mechanically coupled to the mechanically adjustable capacitor for accomplishing the alignment of the receiver section 105.

In summary, the factory alignment methods in accordance with the preferred and alternative embodiments of the present invention comprise the steps of generating a frequency modulated (FM) signal from a reference source 610, wherein the FM signal includes a predetermined pattern of data symbols, and wherein each data symbol modulates the FM signal at one of a plurality of frequency deviations, and wherein each of the plurality of frequency deviations has one of a first and second polarity; receiving and demodulating the FM signal in the receiver section 105; decoding the predetermined pattern of data symbols included in the demodulated FM signal demodulated in the step of receiving and demodulating; determining a first error rate of a first subset of the predetermined pattern the data symbols, wherein the first subset comprises a plurality of data symbols modulated at the first polarity; determining a second error rate of a second subset of the predetermined pattern the data symbols, wherein the second subset comprises a plurality of data symbols modulated at the second polarity; and aligning the receiver section 105 based on the first error rate and the second error rate determined in said determining steps. The alignment is accomplished in the fixed frequency reference 615 of the alternative embodiment of the present invention by making a mechanical adjustment, such as laser trimming a capacitor. The alignment is accomplished in the controlled frequency reference 115 in the preferred embodiment of the present invention by setting a control signal value.

It will be further appreciated that the methods and apparatus described above in accordance with the preferred and alternative embodiments of the present invention can be used with a digital signal having more than two modulation levels, such as a four level frequency modulated radio signal, which results in the generation of four IF signals within the receiver element 103. Such a signal would be more appropriate, for example, when the selective call receiver 100 is used which couples the decoded error rates to the decoder/controller 840. For this example the selective call receiver 100 is designed primarily for decoding a four level frequency modulated radio signal. In this example, the selective call receiver 100 communicates the error rates for four demodulated data symbol subsets, corresponding to the four data symbol levels, to the decoder controller 840, which uses two of the error rates to set the local oscillator frequency in the selective call receiver 100, thereby optimizing the position of the four IF signals within the bandpass of the IF filter 104. The two error rates used are the two error rates associated with the two data symbol levels which modulate the carrier with the maximum absolute deviation.

An advantage of the preferred and alternative embodiments of the present invention over alignment procedures commonly used in the art is that the frequencies of the IF signals will be optimized within the bandpass of the IF filter (or filters, when the IF signals pass through more than one filter component). For example, 455 kHz IF filters, which are used in commonly available selective call receivers, typically have a ±1 kHz make tolerance (part to part maximum variation at room temperature) of the 455 kHz center frequency. The IF filter bandwidth must be wide enough to pass the IF signals without significantly attenuating the IF signals, and therefore must include not only the frequency deviations caused by the modulation of the radio signal by the digital signal (which is approximately 14 kHz in the example used herein), but also part to part and temperature variations of the center frequency of the filter, part to part and temperature variations of the local oscillator frequency, and offsets of the carrier frequency of the intercepted radio signal. The sensitivity of the selective call receiver 100 is degraded when the IF filter bandwidth is increased beyond the minimum necessary for optimum reception of the modulated signal. The alignment method in accordance with the preferred and alternative embodiments of the present invention essentially eliminates the need to design the IF filter with additional bandwidth to include the part to part variations of the IF filter and local oscillator frequency reference. In contrast, prior art alignment method typically only align the local oscillator. Thus, the alignment method in accordance with the preferred and alternative embodiments of the present invention affords a significant further reduction (approximately 2 kHz in the example cited above) in the bandwidth of the IF filter, which significantly improves the sensitivity of the receiver.

Other methods of automatic frequency control require specialized hardware and therefore added cost. The alignment method and apparatus in accordance with the preferred embodiment of the present invention is advantageous because an improved alignment is achieved, resulting in a better receiver sensitivity performance of the receiver, and much of the hardware required to implement this invention is already used in most receivers and therefore the cost impact and parts count impact is minimized. The alignment method in accordance with the alternative embodiment of the present invention is advantageous because an improved alignment is achieved, resulting in a better receiver sensitivity performance of the receiver.

We claim:

1. A method used in one of a factory setup and a maintenance setup for automatically aligning a receiver section of a selective call receiver, the method comprising the steps of:
   generating a frequency modulated (FM) signal from a reference source, wherein the FM signal includes a predetermined pattern of data symbols, and wherein each data symbol modulates the FM signal at one of a plurality of frequency deviations, and wherein each of the plurality of frequency deviations has one of a first polarity and a second polarity;
   receiving and demodulating the FM signal in the receiver section;
   decoding the predetermined pattern of data symbols included in the FM signal demodulated in said step of receiving and demodulating;
   determining a first error rate of a first subset of the predetermined pattern of data symbols, wherein the first subset of data symbols comprises a plurality of data symbols modulated at the first polarity;
   determining a second error rate of a second subset of the predetermined pattern of data symbols, wherein the second subset comprises a plurality of data symbols modulated at the second polarity; and
   aligning the receiver section based on the first error rate and the second error rate determined in said determining steps.

2. The method according to claim 1, wherein said step of aligning the receiver section further comprises a step of laser trimming a capacitor in the receiver section, for altering the frequency of a frequency reference therein.

3. The method according to claim 1, wherein said step of aligning the receiver section further comprises a step of loading an initial value of a control signal into the selective call receiver for storage therein, wherein the control signal is for generating an initial value of a frequent, reference.

4. An automatic frequency controller, coupled to a receiver element, wherein the receiver element receives and demodulates a frequency modulated (FM) signal, and wherein the FM signal includes a plurality of data symbols, and wherein each data symbol modulates the FM signal at one of a plurality of frequency deviations, and wherein each of the plurality of frequency deviations has one of two opposite polarities, the automatic frequency controller comprising:
   an error detector, coupled to said receiver element, wherein said error detector determines error rates of at least two subsets of the data symbols, each subset comprising a plurality of the data symbols modulated at a unique one of the plurality of frequency deviations, and wherein the at least two subsets of the data symbols comprise data symbols of the two opposite polarities;
   a frequency controller, coupled to said error detector, wherein said frequency controller generates a frequency control signal based on the error rates of the at least two subsets of the data symbols; and
   a local oscillator, coupled to said frequency controller, wherein said local oscillator is controlled by the frequency control signal to align said receiver element to the FM signal.

5. The automatic frequency controller according to claim 4, wherein the FM signal is an FM radio signal.

6. The automatic frequency controller according to claim 4, wherein said local oscillator is a phase lock loop oscillator.

7. The automatic frequency controller according to claim 4, wherein said local oscillator is a varactor controlled crystal oscillator.

8. The automatic frequency controller according to claim 4, wherein the data symbols include a predetermined pattern of data symbols and said error detector determines the error rates from the predetermined pattern of data symbols.

9. The automatic frequency controller according to claim 4, wherein the data symbols include error correction data symbols, and said error detector determines the error rates from the error correction data symbols.

10. The automatic frequency controller according to claim 4, further comprising an error rate memory, coupled to said error rate detector and said frequency controller, said error rate memory for storing a plurality of prior error rates, wherein said frequency controller generates the frequency control signal based upon the plurality of prior error rates.

11. The automatic frequency controller according to claim 4 further comprising a control signal memory, coupled to said frequency controller, for storing a value of the frequency control signal, and wherein the frequency controller uses the value of the frequency control signal to generate an initial frequency of the local oscillator.

12. A selective call receiver for processing a frequency modulated (FM) signal, wherein the FM signal includes data symbols, and wherein each data symbol modulates the FM signal at one of a plurality of frequency deviations, and wherein each of the plurality of frequency deviations has one of two opposite polarities, and wherein the FM signal further includes a selective call address, the selective call receiver comprising:
   a receiver element which receives and demodulates the FM signal;
   a control circuit, coupled to said receiver element, which decodes the data symbols and the selective call address included in the FM signal, and which generates an alert signal when the selective call address matches an address stored in the selective call receiver;
   a sensible alert, coupled to the control circuit, which is responsive to the alert signal for generating a sensible alert signal; and
   an automatic frequency controller, coupled to said receiver element and said control circuit, the automatic frequency controller comprising
   an error detector, coupled to said control circuit, wherein said error detector determines error rates of at least two subsets of the data symbols, each subset comprising a plurality of the data symbols modulated at a unique one of the plurality of frequency deviations, and wherein the at least two subsets comprise data symbols of the two opposite polarities,
   a frequency controller, coupled to said error detector, wherein said frequency controller generates a frequency control signal based on the error rates of the at least two subsets of the data symbols, and
   a local oscillator, coupled to said frequency controller and said receiver element, wherein said local oscillator is controlled by the frequency control signal to align said receiver element to the FM signal.

13. A method used in a receiver for aligning the receiver to a frequency modulated (FM) signal, wherein the FM signal includes data symbols, and wherein each of the data symbols modulates the FM signal at one of a plurality of frequency deviations, and wherein each of the plurality of frequency deviations has one of two opposite polarities, and wherein the receiver includes a receiver section which is aligned by a local oscillator, the method comprising the steps of:

intercepting and demodulating the FM signal, including the data symbols;

determining error rates of at least two subsets of the data symbols, each of the at least two subsets other of the data symbols comprising a plurality of the data symbols modulated at a unique one of the plurality of frequency deviations, and wherein the at least two subsets comprise the data symbols of the two opposite polarities;

generating a frequency control signal based on the error rates determined in said determining step; and aligning the receiver section to the FM signal by controlling the local oscillator responsive to the frequency control signal.

14. The method according to claim 13, further comprising the steps of:

storing a value of the frequency control signal; and using the value stored in said storing step as an initial value of a control signal for generating an initial value of a frequency reference.

15. The method according to claim 13, wherein the data symbols include a predetermined pattern of data symbols and wherein said determining step, comprises the step of determining the error rates from the predetermined pattern of data symbols.

16. The method according to claim 13, wherein the data symbols include error correction data symbols, and wherein said determining step comprises the step of determining error rates from the error correction data symbols.

17. A method according to claim 13, further comprising the step of storing as a set the error rates determined in said determining step, and wherein in said generating step, the control signal is generated based upon the set of error rates stored in said storing step.

* * * * *

UNITED STATES PATENT AND TRADEMARK OFFICE
CERTIFICATE OF CORRECTION

PATENT NO. : 5,479,452
DATED : December 26, 1995
INVENTOR(S) : Hayes, et al.

It is certified that error appears in the above-indentified patent and that said Letters Patent is hereby corrected as shown below:

Claim 1, Column 15, Line 7, change "of-a" to --of a--.

Claim 3, Column 15, Line 41, change "frequent", to --frequency--

Claim 13, Column 17, Line 9, after "subsets" delete "other".

Signed and Sealed this

Thirtieth Day of July, 1996

Attest:

BRUCE LEHMAN

Attesting Officer

Commissioner of Patents and Trademarks